United States Patent [19]

Kimata et al.

[11] Patent Number: 4,735,548
[45] Date of Patent: Apr. 5, 1988

[54] CARRIER SYSTEM FOR CLEAN ROOM

[75] Inventors: Kazuo Kimata, Bisai; Susumu Ishikawa, Aichi, both of Japan

[73] Assignee: MECS Corporation, Bisai, Japan

[21] Appl. No.: 39,862

[22] Filed: Apr. 20, 1987

[51] Int. Cl.$^4$ .............................................. B66C 23/00
[52] U.S. Cl. .................................. 414/744 R; 414/749
[58] Field of Search ............... 414/744 A, 744 R, 749, 414/751, 718, 728; 901/17, 21, 47

[56] References Cited

U.S. PATENT DOCUMENTS

| | | | |
|---|---|---|---|
| 3,825,245 | 7/1974 | Osburn et al. | 414/744 R |
| 4,366,423 | 12/1982 | Inaba et al. | 901/17 X |
| 4,507,044 | 3/1985 | Hutchins et al. | 901/17 X |
| 4,566,346 | 1/1986 | Petiteau | 414/749 X |
| 4,566,847 | 1/1986 | Maeda et al. | 901/17 X |

*Primary Examiner*—L. J. Paperner
*Assistant Examiner*—Donald W. Underwood
*Attorney, Agent, or Firm*—Armstrong, Nikaido, Marmelstein & Kubovcik

[57] ABSTRACT

A carrier system which carries electronic parts mounted on an arm to arbitrary positions within a clean room is disclosed. This carrier system is arranged such that: a screw shaft is perpendicularly provided in a rotationally drivable manner between an upper plate and a bottom plate which are vertically connected through a plurality of guide bars to each other; a movable plate is so disposed as to be vertically movable by the rotation of the screw shaft and is guided by the guide bars in a vertically slidable manner between the upper plate and the bottom plate; a cylindrical member is perpendicularly so provided on the movable plate as to be rotationally drivable which penetrates the upper plate and protrudes upwards; a horizontal moving member is fixed to an upper end of the cylindrical member; a carriage equipped with the arm is so disposed as to be horizontally movable on the horizontal moving member; and a driving wire spanned between pulleys which are axially supported within the horizontal moving member is secured to the carriage. Hence, it is feasible to carry the electronic parts like a silicon wafer in three dimensions within the clean room and to transfer the electronic parts to arbitrary positions with high efficiency without deteriorating the cleanness in the clean room.

3 Claims, 9 Drawing Sheets

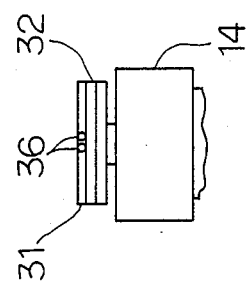
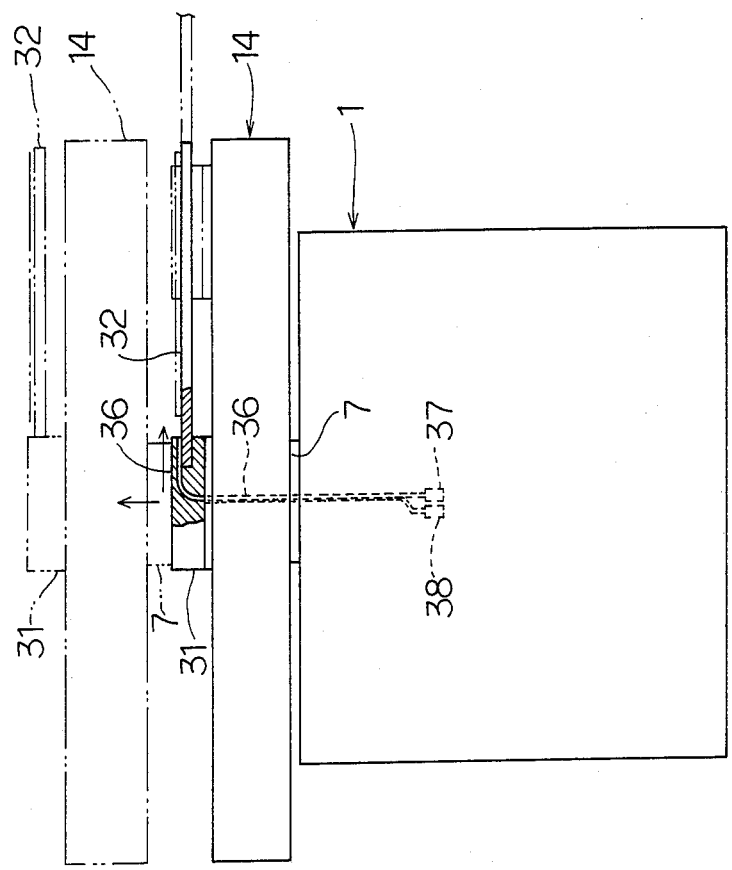

CARRIER SYSTEM FOR CLEAN ROOM

BACKGROUND OF THE INVENTION

1. Field of the Invention

The present invention is concerned with a carrier system for carrying electronic parts such as a silicon wafer, surface glass for an LCD, a photomask for an IC or the like in or out of a variety of processing devices and measuring devices within a clean room.

2. Prior Art

In the case of effecting various kinds of processes on, for instance, silicon wafers or measuring its performance by means of a measuring device, these operations are to be performed in a clean room which has to be shut off from the dust. The silicon wafers are in general accomodated in a shelf type cassette; and a carrier system for taking each individual wafer therefrom and carrying it onto a stage of the processing device or the like requires a means appropriated to the clean room in which infinitesimal drops of oil and metallic powder are not absolutely present.

As a conventional carrier system of this type, a belt conveyor type device has already been put into practical use. However, since such a device is incapable of moving vertically or laterally, a lifting/lowering device needs to be provided in the cassette accomodating the wafers. In addition, a process in which the wafers are taken in and out is confined to one direction, and the placement of the cassette and of the processing device is likewise limited, thereby unfavourably restricting an installation space in the clean room.

On the other hand, there has heretofore been proposed a method of carrying the silicon wafers with the help of a carriage. If a general linear way be adopted for the purpose of stably moving the carriage with high accuracy, the metallic powder and the infinitesimal drops of oil will be scattered from grooves provided with a multiplicity of rigid balls used for the linear way, which leads to such a problem that the clean room is degraded in cleanness.

SUMMARY OF THE INVENTION

A carrier system for carrying electronic parts to arbitrary positions by loading an arm with them with in a clean room according to the present invention comprises: a screw shaft rotatably and perpendicularly provided between a bottom plate and an upper plate which are linked to each other with the aid of a plurality of guide bars; a movable plate disposed between the upper plate and the bottom plate so that the movable plate is guided by the guide bars in a vertically slidable manner and makes an up-and-down motion by dint of rotation of the screw shaft; a cylindrical member vertically and rotatably provided on the movable plate, this cylindrical member protruding upwards such as to penetrate the upper plate; a horizontal moving member fixed to an upper end of the cylindrical member; a carriage disposed on the horizontal moving member in a horizontally movable manner, this carriage being equipped with an arm; and a driving wire spanned between pulleys which are axially supported within the horizontal moving member, this wire being secured to the carriage.

It is a primary object of the present invention to provide the carrier system designed for the clean room which is capable of carrying the electronic parts such as the silicon wafer or the like to the arbitrary positions within the clean room with high efficiency and security and preventing the cleanness in the clean room from being deteriorated.

BRIEF DESCRIPTION OF THE DRAWINGS

FIG. 10 is a front view of the carrier system equipped with a handling sensor;

FIG. 11 is a right side view showing the upper portion of the carrier system;

DESCRIPTION OF THE PREFERRED EMBODIMENTS

The embodiment of the present invention will hereinafter be described with reference to the accompanying drawings.

Figure 1:
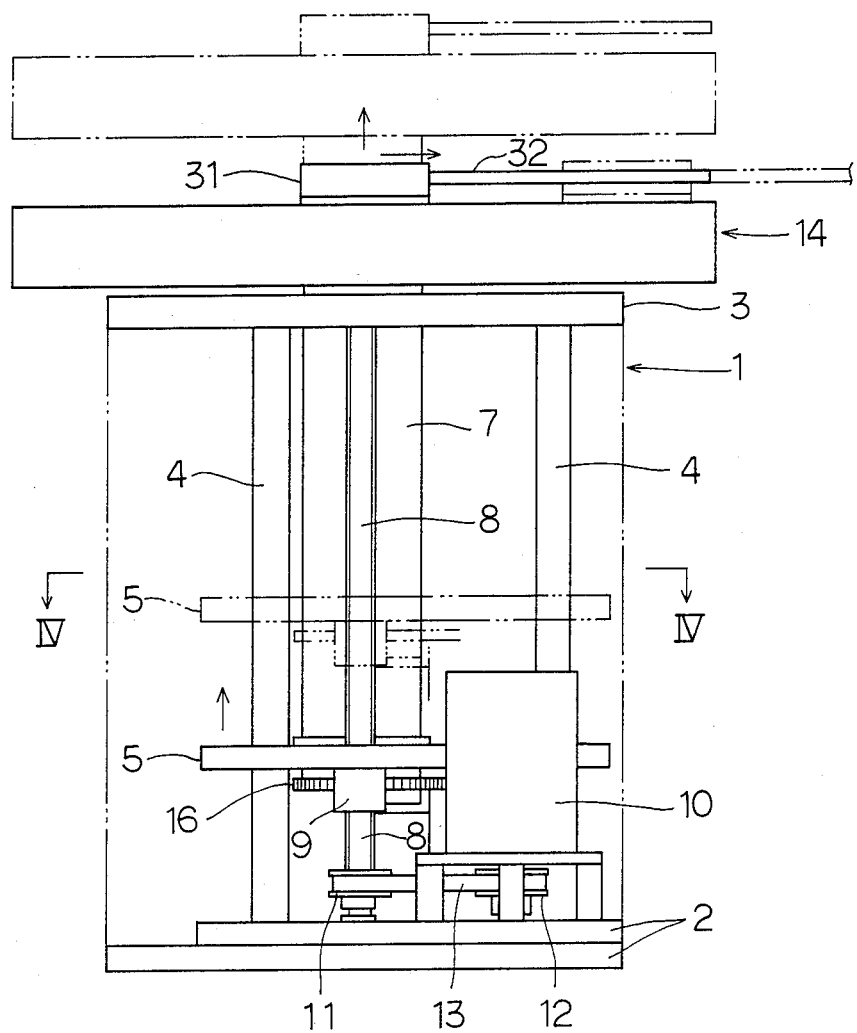
FIG. 1 is a front view showing a state in which an outer cover of a carrier system is removed.
Figure 2:
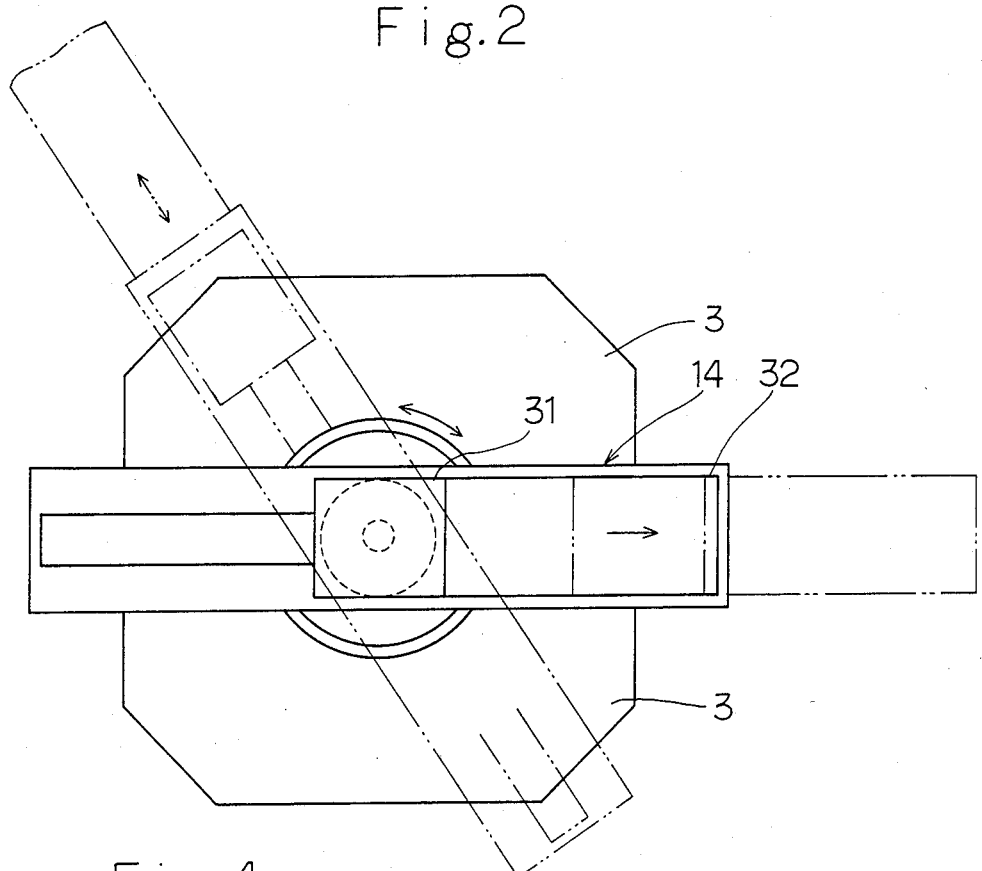
FIG. 2 is a plan view thereof.
Figure 4:
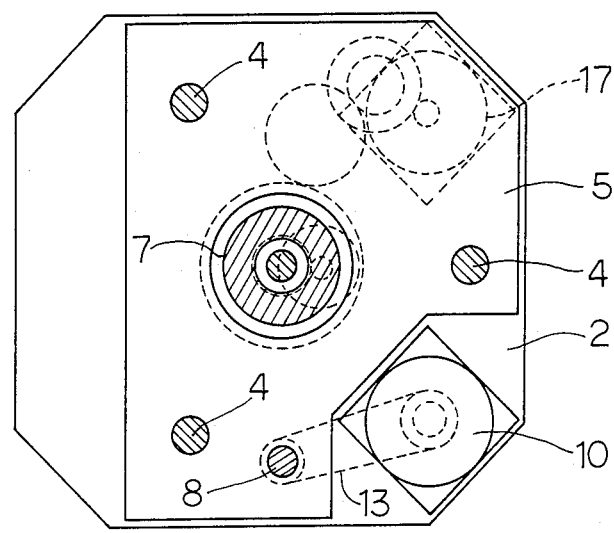
FIG. 4 is a sectional view taken substantially along the line IV—IV of FIG. 1.
Figure 3:
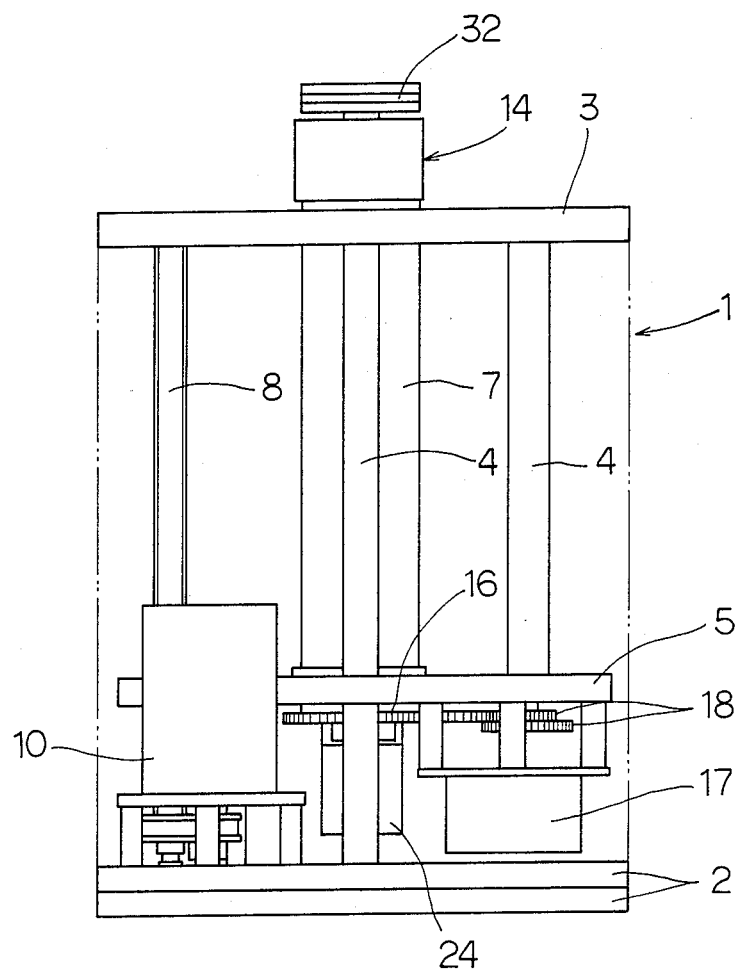
FIG. 3 is a right side view thereof.
Figure 5:
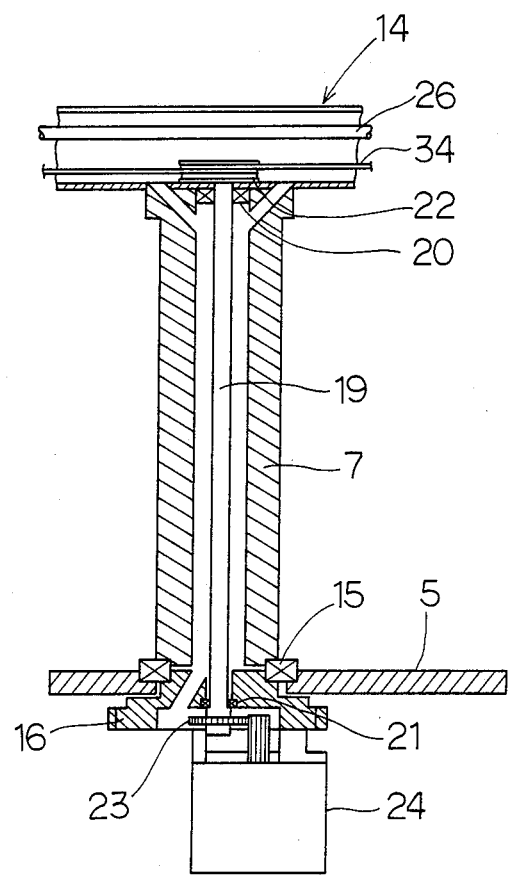
FIG. 5 is a cross-sectional view of a central portion of FIG. 1.

FIG. 1 is a front view of a carrier system for carrying silicon wafers within a clean room; FIG. 2 is a plan view thereof; and FIG. 3 is a right side view thereof. Referring to FIGS. 1 and 3, there is shown a body of the carrier system in a state where a cover of the body 1 is taken off. A bottom plate 2 and an upper plate 3 are linked to each other with the aid of three pieces of guide bars 4. A movable plate 5 is disposed in a vertically movable manner and is at the same time guided by the three guide bars 4. The movable plate 5 horizontally fluctuates by dint of action of ball screws. A cylindrical member 7 is, as illustrated in FIG. 5, perpendicularly and rotatably provided at the central portion of the movable plate 5 through a bearing 15. A screw shaft 8 of the ball screw is rotatably and perpendicularly provided between the bottom plate 2 and the upper plate 3. The screw shaft 8 is inserted through the intermediary of the rigid balls into an internal thread 9 formed in a part of the movable plate 5. The screw shaft 8 is rotationally driven by a vertical movement motor 10 mounted on the bottom plate 2 through pulleys 11, 12 and through a belt 13, whereby the movable plate 5 moves up and down. The cylindrical member 7 perpendicularly provided on the movable plate 5 protrudes upwards from a hole formed in the central portion of the upper plate 3. A horizontal moving member 14 is horizontally fixed to the upper end of the cylindrical member 7. On the other hand, a gear 16 is attached to the lower end of the cylindrical member 7. This gear is, as illustrated in FIG. 3, further linked through a plurality of gearwheels 18 to a turning motor 17 fixed to an under surface of the movable plate 5. The cylindrical member 7 and the horizontal moving member 14 are rotated through approximately 360° by dint of the rotation of the turning motor 17. As illustrated in FIG. 5, a shaft 19 is provided within the cylindrical member 7, and bearings 20, 21 are interposed therebetween. The upper end of the shaft 19 enters the horizontal moving member 14, in which position a driving pulley 22 is axially installed. The lower end of this driving pulley 22 is fitted in a recessed portion formed in the gear 16, in which position a pinion 23 is axially attached. A horizontal moving motor 24 by which the shaft 19 is driven through the pinion 23 is fixed to an under surface of the gear 16 provided at the lower end of the cylindrical member 7. Owing to this arrangement, the driving pulley 22 within the horizontal moving member 14 is rotationally driven. A space formed in the cylindrical member 7 communicates with the inside of the horizontal moving member 14, and a wire for a sensor or the like is distributed therethrough.

Figure 6:
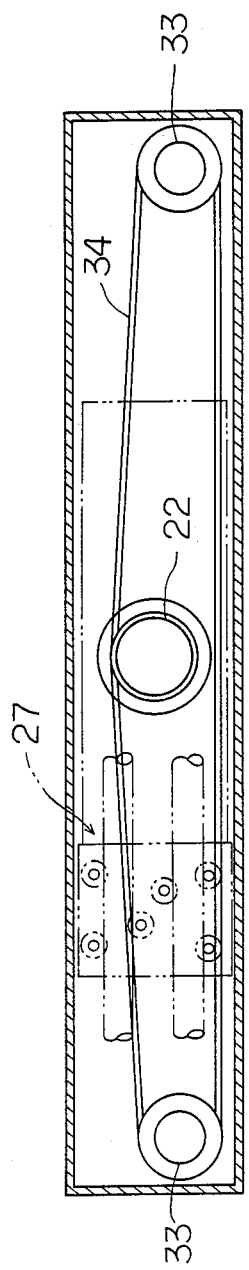
FIG. 6 is an enlarged horizontal sectional view of a horizontal moving member.
Figure 7:
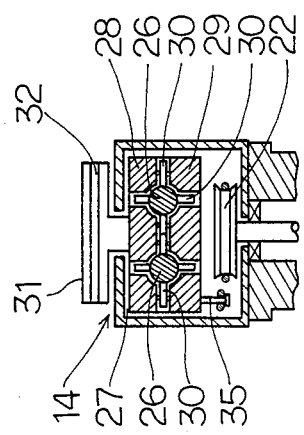
FIG. 7 is an enlarged cross-sectional view of the horizontal moving member.

The horizontal moving member 14 is, as shown in FIGS. 6 and 7, so formed as to assume a configuration like a long thin box. A slit-like opening is formed in the upper surface of the horizontal moving member 14 in the longitudinal direction thereof. Two pieces of guide shafts 26 are disposed at a given spacing in the horizontal moving member 14 in its longitudinal direction. A carriage 27 is so supported on the guide shafts 26 as to be horizontally movable. Fourteen rollers 30 are axially supported in lateral and vertical directions between the carriage 27, the upper plate 28 and the lower plate 29. Each individual roller 30 impinges upon the guide shaft 26, and the carriage 27 is allowed to travel in the longitudinal direction of the horizontal moving member 14. An arm installation member 31 is so provided on the upper plate 28 of the carriage 27 as to project upwards from the opening formed in the upper portion of the horizontal moving member 14. A handling plate-like arm 32 is horizontally fitted to the arm installation member 31 which juts out upwards. A sensor for detecting the silicon wafers which is illustrated in FIGS. 10, 11 may be so provided that it faces the arm 32 of the arm installation member 31. This kind of sensor is composed by two strings of optical fibers 36, a light projecting element and a light receiving element which are fitted to terminals of the optical fibers 36. The tips of the two optical fibers 36 are arranged in the direction parallel to the surface of the arm 32, standing on the side of the arm of the arm installation member 31. The terminals of the optical fibers 36 are led to the carriage or into the body 1.

The light is project from the light projecting optical fiber 36 in the direction parallel to the surface of the arm 32. If the silicon wafer remains on the arm 32, the light reflected by the edge thereof enters the light receiving optical fiber 36. The reflected light is detected in the light receiving element 8, thus detecting the fact that the silicon wafer exists on the arm 32.

It can also be considered that the sensor is disposed upwards within the arm 32. The silicon wafer includes an orientation flat (a notched portion), and if this portion be situated above the sensor, it will become unfeasible to detect the silicon wafer. It is, however, possible to invariably detect the edge of the loaded silicon wafer by placing the sensor in the above-described manner. The wafer on the arm 32 can be detected regardless of the position of the orientation flat of the silicon wafer.

On the other hand, pulleys 33 are axially supported on both ends of the bottom within the horizontal moving member 14, and a wire 34 coated with synthetic resin is spanned with proper tension between the aforementioned driving pulley 22 disposed at the central portion and the bilaterally disposed pulleys 33. The driving pulley 22 is wound with a turn of the wire 34, and similarly a hook 35 projecting downwards from the lower plate 29 of the carriage 27 positioned upwards is wound with a turn of the wire 34. The carriage 27 travels within the horizontal moving member 14 by dint of the rotational movement of the wire 34.

It is to be noted that the above-mentioned gear, gearwheel and pinion are composed of the synthetic resin in order to prevent creation of the metallic powder which is caused by the metallic abrasion.

Figure 8:
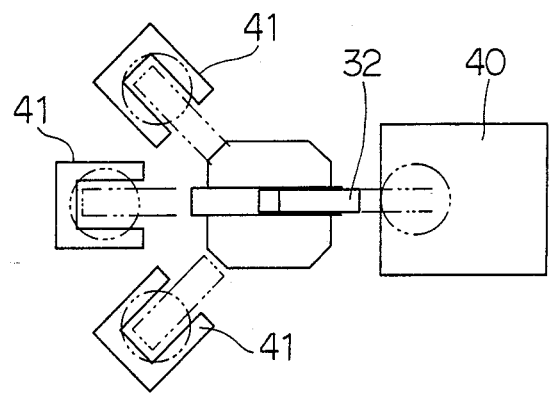
FIG. 8 is a plan view showing placement of the carrier system.
Figure 9:
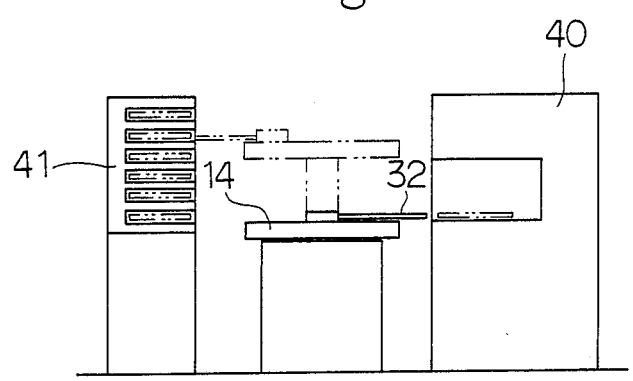
FIG. 9 is front view showing the placement of the carrier system.

In the clean room is installed the thus constructed carrier system which is utilised in such a way that the silicon wafers are carried from the shelf type cassette onto the stage of the processing device, and the silicon wafers are made to revert to the predetermined positions of the cassette. The arm 32 loaded with the silicon wafer is capable of making the up-and-down motion, turning motion and horizontal to-and-fro motion. The carrier system is, as shown in FIGS. 8 and 9, installed in front of a unit of processing device 40, and a plurality of cassettes 41 each having multistage shelf are so arranged as to stand vis-à-vis with the processing device 40. With this arrangement, it is feasible to effectively utilise the space formed within the clean room.

For instance, the arm 32 is placed in such a position as shown in FIGS. 8, 9, and when taking the silicon wafers out of the upper end of the cassette 41 disposed just behind the arm, the cylindrical member 7 and the horizontal moving member 14 are made to rotate through approximately 180° by driving the turning motor 17. Then the arm 32 is made to face the cassette 41, and the same instant the vertical movement motor 10 is actuated, whereby the movable plate 5, the cylindrical member 7 and the horizontal moving member 14 are raised up to a desired level of the shelf. In the wake of this step, a horizontal movement motor 24 is actuated, and the carriage 27 moves on the horizontal moving member 14 towards the cassette 41 by dint of the rotational movement of the driving pulley 22 and the wire 34, whereby the arm 32 is inserted beneath the desired shelf. In such a state, upon slight actuation of the vertical movement motor 10, the arm 32 (the entire horizontal moving member) is a little bit raised, and the silicon wafer is loaded on the arm 32. In the second place, the horizontal movement motor 24 resumes its operation, and then the carriage 27—the arm 32—reverts to the central portion while being loaded with the wafer. Subsequently, immediately when the vertical movement motor 24 and the turning motor 17 are actuated, the arm 32 returns to the initial position opposite to the stage of the processing device 40. Then the horizontal movement motor 24 is operated once again, whereby the arm moves forwards. The vertical movement motor 10 is slightly actuated in order to lower the arm 32 a little bit while the wafer is brought close to the stage. Subsequently, the wafer is placed on the stage of the processing device 40. Thereafter, the carriage 27 and the arm 32 return to their initial positions.

Upon completion of the processes by the processing device, the arm 32 of the carrier system is operated in the reversed order of the above-described steps. The arm 32 advances onto the stage to raise the wafer and carry this wafer up to the very shelf of the cassette 41 from which the the wafer is taken, thus returning the wafer to the shelf. Such operations are repeated with respect to the individual wafers which are put on the shelves of each cassette. The processes indispensable for the transfer of the silicon wafers are thus executed.

According to the above-mentioned carrier system, inasmuch as the arm for carrying the electronic parts while being loaded with them is capable of making the horizontal, up-and-down and turning motions, it is possible to carry the electronic parts in three dimensions. As a result, a conventionally required lift/lowering device of the cassette which accomodates the electronic parts becomes unnecessary. In addition, since the cassette can be installed in the arbitrary position within the clean room, the installation space inclusive of the cassette or the like can be diminished.

The operations of the foregoing carrier system can manually be performed by the use of control panel equipped with switches or may be done under full-automatic program control with the help of a sequence controller which employs a microcomputer. In such a case, the controller is invested with a teaching function so as to store coordinates of the respective shelves of each individual cassette. With this arrangement, the usability is expanded to such an extent that the position of the cassette and the level of the shelf are freely determined.

In the above-described embodiment, the arm 32 carries the silicon wafer by placing it thereon. However, a still safer transport is possible due to such a structure that adsoptive holes through which the air is sucked thereinto are formed in the upper surface of the arm 32.

Figure 12:
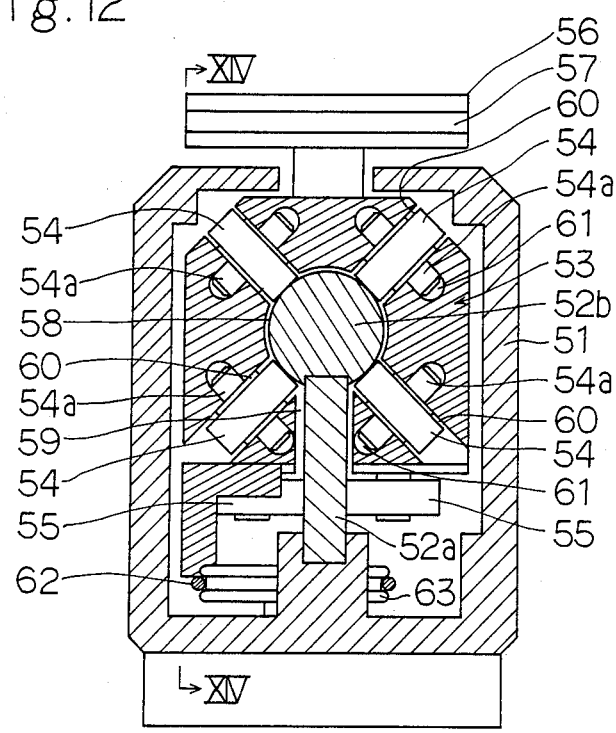
FIG. 12 is a cross-sectional view showing the upper portion of the carrier system in another embodiment.
Figure 14:
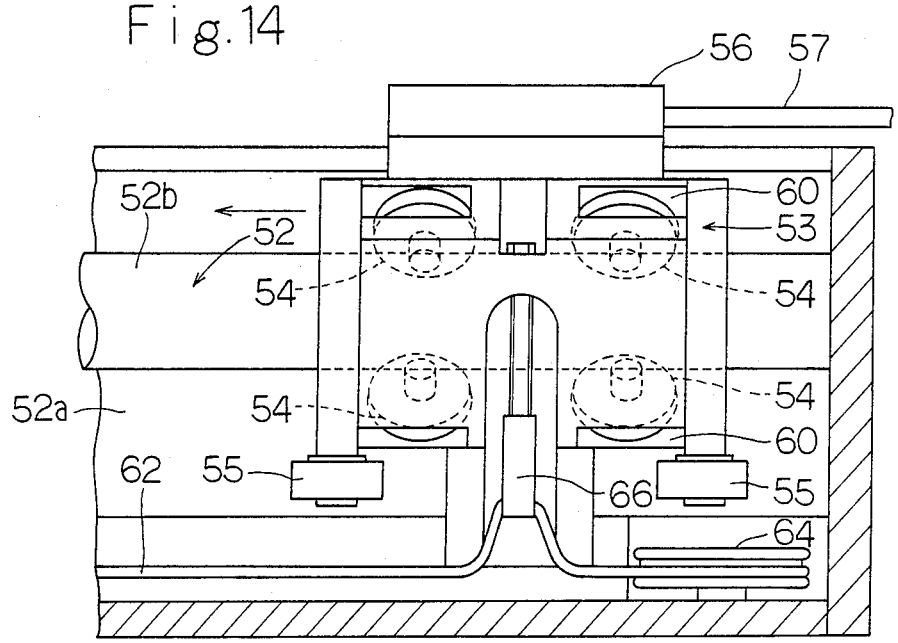
FIG. 14 is a sectional view taken substantially along the line XIV—XIV of FIG. 12.
Figure 13:
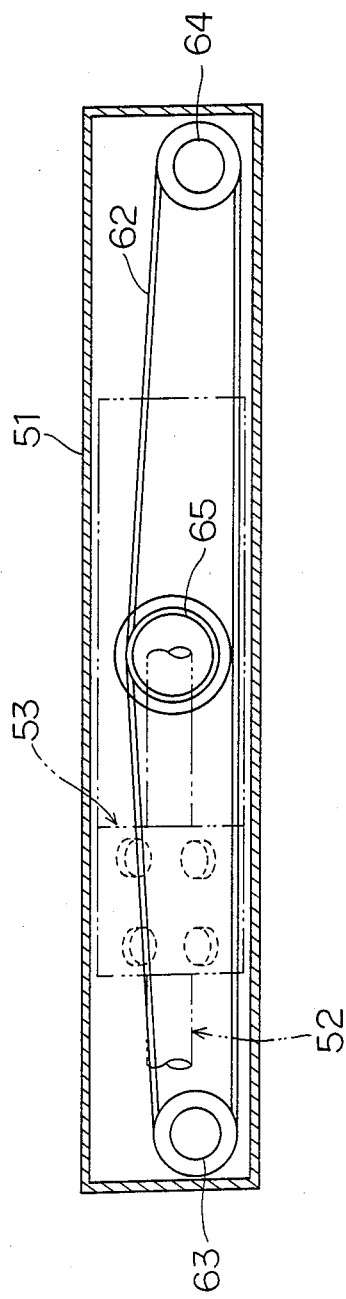
FIG. 13 is a scale-down longitudinal sectional view thereof.

FIGS. 12 to 14 in combination show another embodiment of the carriage.

This carriage is arranged to travel on a single rail 52; and within the horizontal moving member 51 the rail 52 is laid in the longitudinal direction thereof. The rail 52 is constituted by fixing a rod member 52b which assumes circularity in section to a tabular member 52a. The carriage 53 is disposed astride the rail 52. The carriage 53 is formed with recessed portions (a cylindrical recessed portion 58 and a tabular recessed portion communicating with the former recessed portion 58) through which the rail 52 passes. Furthermore, wheel insertion grooves 60 inclined at an angle of approximately 45° to the cylindrical recessed portion 58 are formed in the carriage 53. To be specific, these grooves 60 are, as illustrated in a sectional view of FIG. 12, formed in front and in rear of the carriage 53 in such a radial configuration as to make angles of approximately 45° to the horizontal axis about the cylindrical recessed portion 58. A groove 61 used for insertion of a spindle of every wheel is so formed as to intersect each of eight stripes of the grooves 60. Wheels 54 composed by fitting spindles 54a into inner rings of antifriction bearings are respectively inserted in the eight grooves 60 which are formed in front and in rear of the carriage 53. From the front and rear sides of the carriage 53, fixing members are fitted in the grooves 61 in which the spindles 54a are inserted, and front and back plates are fixed in front and in rear of the carriage 53, thus installing the wheels in the predetermined positions. An outer peripheral portion of the wheel 54 of the carriage 53, i.e., the outer ring of the antifriction bearing surely impinges upon the the outer peripheral surface of the rod member 52b. Fifty four wheels 55 are so attached to the lower portion of the carriage 53 in such a way that the tabular member 52a of the rail 52 is sandwiched in between the wheels. These wheels 55 are, as in the case of above-described arrangement, composed by fitting the spindles into the inner rings of the antifriction bearings; and the outer rings thereof impinge upon the surface of the tabular member 52a. Consequently, the carriage 53 is so disposed within the horizontal moving member 51 as to be travelable on the rail 52 while being guided by sixty two wheels which employ the antifriction bearings. An opening is formed in the upper portion of the horizontal moving member 51 in the longitudinal direction thereof. An installation member 56 is fixed to the upper portion of the carriage 53 in such a way that this installation member 56 protrudes upwards from the aforementioned opening; and an arm 57 is horizontally provided in front of the installation member 56. On the other hand, a driving wire 62 for driving the carriage 53 is spanned between pulleys 63, 64 at the bottom of the horizontal moving member 51. A driving pulley 65 provided at the center in the horizontal moving member 51 is wound with one end of a driving wire 62, while at the same time the other end of the wire 62 is fixedly hung on a tension adjusting member 66 attached to the side portion of the carriage 53. The horizontal moving member 51 is fixed to a cylindrical member 67 which is linked to an unillustrated vertical movement mechanism and to a turning mechanism. A rotary driving shaft (not illustrated) perpendicularly passes through the cylindrical member 67. The tip of the rotary driving shaft protrudes and is further connected to the driving pulley 65.

The thus constructed carrier system behaves such that: the driving pulley 65 rotates by dint of the unillustrated rotary driving shaft, thereby rotating the driving wire 62 wound thereon; the carriage 53 travels on the rail 52 laid in the horizontal moving member 51 with the aid of the driving wire 62; and the arm 57 is loaded with the silicon wafer so as to carry it to a predetermined position. At this time, eight pieces of the wheels 54 and four pieces wheels 55 engage with the rail 52 in a highly accurate manner with no play, which enables the carriage 53 to stably travel thereon without rattling. The wheels 54, 55 are composed by the antifriction bearings, and internal rigid balls are hermetically sealed with almost no gap. Hence, infinitesimal drops of oil and metallic powder are not scattered at all, thereby making it possible to maintain a high degree of cleanness within the clean room. Particularly, the wheels 54 roll while impinging upon the crooked surface of the rod member 52b of the rail 52. The area of impingement verges on a state similar to point contact, thereby lessening the abrasion and the creation of the metallic powder.

What is claimed is:

1. A carrier system for a clean room, comprising:
   (a) a bottom plate;
   (b) an upper plate fixed to a plurality of guide bars which are perpendicularly provided on said bottom plate;
   (c) a screw shaft perpendicularly provided in a rotatably drivable manner between said upper plate and said bottom plate;
   (d) a movable plate vertically driven by dint of rotation of said screw shaft, said movable plate being so disposed between said upper plate and said bottom plate as to be guided by said guide bars in a vertically slidable manner;
   (e) a cylindrical member perpendicularly provided on said movable plate in a rotatably drivable manner, said cylindrical member penetrating said upper plate and protruding upwards;

(f) a horizontal moving member fixed to an upper end of said cylindrical member;

(g) a carriage linked to a driving wire spanned between pulleys which are axially supported within said horizontal moving member, said carriage being so disposed within said horizontal moving member as to be horizontally movable; and (h) an arm, horizontally installed on said carriage, for undergoing the loading of an object to be carried.

2. A carrier system for a clean room as set forth in claim 1, wherein two strings of optical fibers the tips of which face in the direction parallel to a surface of said arm are disposed at the place to which said arm is fitted, wherein a light projecting element is connected to a terminal of one of said optical fibers, and wherein a light receiving element is connected to a terminal of the other optical fiber.

3. A carrier system for a clean room as set forth in claim 1, wherein a rail consisting of a tabular member and of a rod member is laid within said horizontal moving member, said carriage is installed astride said rail, wherein said carriage includes a plurality of pairs of wheels in such a way that said rod member of said rail is obliquely sandwiched in between said wheels, each of said wheels being constituted by fitting a spindle into an inner ring of an antifriction bearing, and wherein said wheels are disposed at the lower portion of said carriage in such a way that said tabular member of said rail is interposed in between said wheels.

* * * * *